(12) United States Patent
Sasaki (10) Patent No.: US 6,485,619 B2
(45) Date of Patent: Nov. 26, 2002

(54) METHOD FOR FORMING METAL OXIDE FILM

(75) Inventor: Tokuhito Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/987,324

(22) Filed: Nov. 14, 2001

(65) Prior Publication Data

US 2002/0084182 A1 Jul. 4, 2002

(30) Foreign Application Priority Data

Nov. 14, 2000 (JP) .................................... 2000-346138

(51) Int. Cl.[7] .............................................. C23C 14/34
(52) U.S. Cl. .......................... 204/192.22; 204/192.1; 204/192.12
(58) Field of Search .................... 204/192.1, 192.12, 204/192.22; 216/37

(56) References Cited

U.S. PATENT DOCUMENTS 4,790,920 A * 12/1988 Krzanich ............... 204/192.17
5,772,858 A * 6/1998 Tepman ................. 204/192.12
6,264,709 B1 * 7/2001 Yoon et al. .............. 29/623.5

OTHER PUBLICATIONS

Optical Engineering, Jerominek et al., "*Vanadium Oxide Films For Optical Switching and Detection*", 09/93, vol. 32, No. 9, pp. 2092–2093.

* cited by examiner

*Primary Examiner*—Steven H. Ver Steeg
(74) *Attorney, Agent, or Firm*—Young & Thompson (57) ABSTRACT

A metal film made of titanium is formed on a surface of a wafer. Then, the metal film is subjected to a patterning process to selectively remove undesired portions to form a metal film on an outer area of the wafer and a lattice-patterned metal film on a pattern area of the wafer. The lattice-patterned metal film is formed on an area corresponding to scribe lines of devices to be arranged in a matrix on the wafer. Then, the metal films are connected to a ground. Subsequently, a vanadium oxide film is formed on the wafer using a sputtering process. Therefore, the vanadium oxide film is prevented from becoming charged at the time of deposition thereof on the wafer to suppress increasing of self bias potential and attain uniformity in resistance value of the vanadium oxide film.

14 Claims, 7 Drawing Sheets

METHOD FOR FORMING METAL OXIDE FILM

BACKGROUND OF THE INVENTION

1. Field of the Invention

The present invention relates to a method for forming a metal oxide film using a sputtering process. Specifically, the present invention relates to a method for forming a metal oxide film made of a bolometer material to be used for a two-dimensional infrared imaging apparatus of the non-cooling type which performs the detection of infrared radiation through the use of variations in resistance with temperature variations.

2. Description of the Related Art

Generally, metal oxides having comparatively large variations in resistance with temperature (i.e., temperature coefficient resistances: TCRS) have been provided as bolometer materials to be used in the non-cooling type two-dimensional infrared imaging apparatus. Among them, vanadium oxide ($VO_x$) is known as such a material which is able to easily obtain a high TCR, and is thus formed as a thin film to be used as a sensor of the temperature-measuring apparatus or the non-cooling type two-dimensional infrared imaging apparatus.

The method for forming such a metal oxide thin film typically includes a physical deposition process, such as vacuum evaporation, or a sputtering process. Among them, the sputtering process is used extensively because of its excellent productivity. For instance, the method for forming a $VO_x$ thin film using a sputtering process is disclosed in Jerominek et al., Optical Engineering, a second paragraph of page 2093, vol. 32-9, 1993.

In order to form the above metal oxide film using the sputtering process, a reactive sputtering process may be employed. In the reactive sputtering process, a cathode target made of a pure metal or a metal oxide is arranged in a sputtering chamber and an anode stage is then arranged to face the cathode target, followed by placing a wafer on the anode stage. Subsequently, argon (Ar) is introduced as a sputtering gas and oxygen ($O_2$) is introduced as a reaction gas in the sputtering chamber, followed by subjecting to an electric discharge process. Consequently, a metal oxide film can be deposited on the surface of the wafer. By the way, for the use of a metal oxide film in the two-dimensional infrared imaging apparatus or the like, it is very important to make the thin film on the wafer so that the characteristics of the thin film are extremely consistent across the surface of the wafer.

Regardless of such an importance, there is a problem that the characteristics of the metal oxide film on the surface of the wafer become uneven when the metal oxide film is deposited on the wafer using the conventional reactive sputtering process. In addition, there is another problem that the characteristics of the metal oxide film formed on the wafer may be varied depending on the type of the sputtering apparatus, i.e., a sheet-fed type sputtering apparatus in which wafers are processed one by one or a batch type sputtering apparatus in which plural wafers are simultaneously processed.

The reason of causing such a problem is the generation of positive self bias potential on the surface of the wafer. As the surface of the wafer is covered with an interlayer film with sufficient electrical insulation (e.g., a silicon oxide film ($SiO_2$) or a silicon nitride film ($SiN_x$)), the surface of the wafer may become positively charged as a result of dielectric polarization caused in the insulation film when the discharge is initiated after placing the wafer on the anode stage. Similarly, the surface of the wafer may become positively charged to have a self bias potential in spite of a smaller insulation value compared with that of the above insulation film in a case where a metal oxide film to be formed by the sputtering process has an insufficient electrical conductivity compared with that of a pure metal. Such a metal oxide film may be, for example, a semiconductor metal oxide film with a resistibility of $1 \times 10^{-5}$ to 100 $\Omega \cdot m$.

Figure 1:
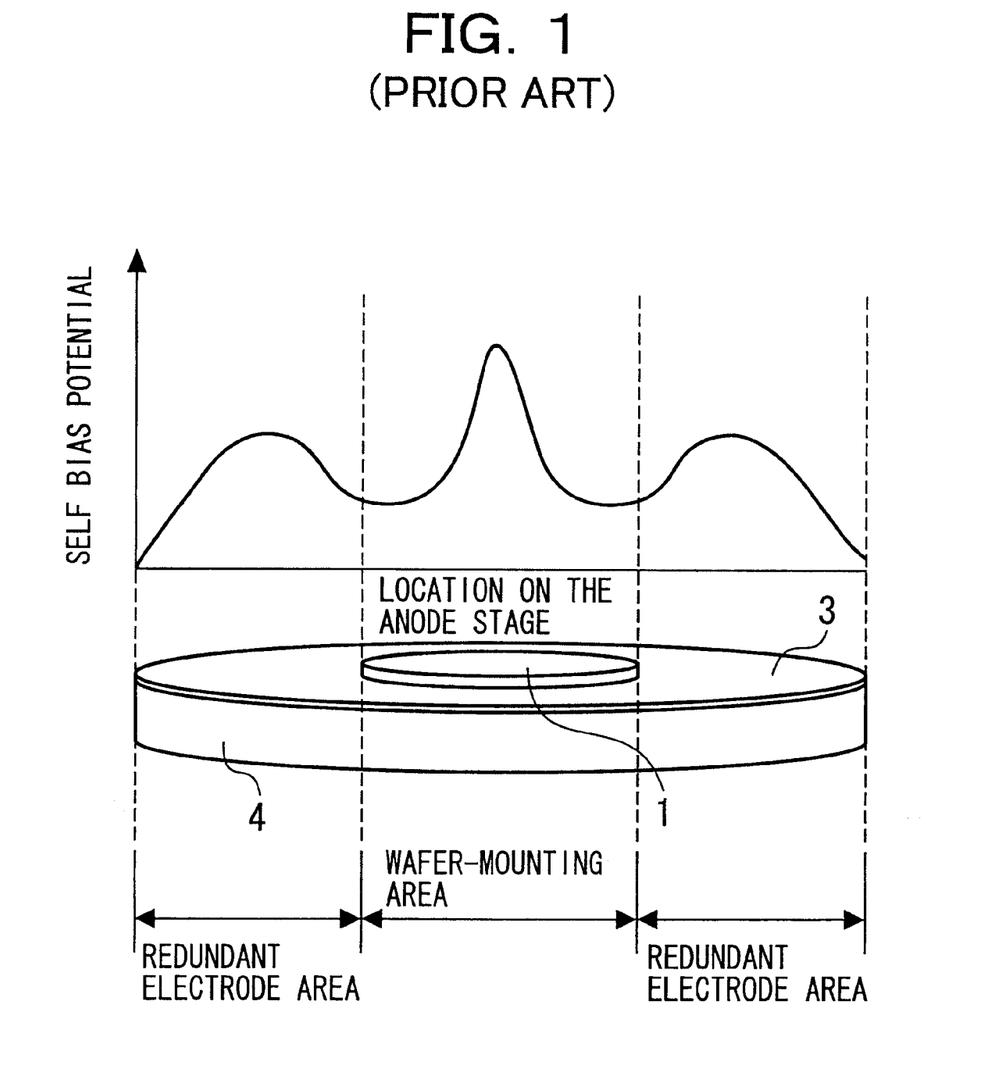
FIG. 1 is a schematic perspective diagram that shows the inside of a conventional sputtering apparatus where a wafer is placed on an anode stage, together with a graph that schematically shows the distribution of self bias potentials on the surface of the wafer, in which the locations on the anode stage are plotted on the horizontal axis and the self bias potentials corresponding to the respective locations are plotted on the vertical axis.

We will explain the self bias potential as follows. FIG. 1 is a schematic perspective diagram that shows the inside of the conventional sputtering apparatus where a wafer 1 is placed on an anode stage 4. In this figure, also, there is a graph that schematically shows the distribution of self bias potentials on the wafer, in which the locations on the anode stage are plotted on the horizontal axis and the self bias potentials corresponding to the respective locations are plotted on the vertical axis. By the way, the horizontal axis of the graph also corresponds to the positions of the anode stage 4 and the wafer 1. In this case, the anode stage 4 has a diameter of 13 inches (33 cm). As shown in FIG. 1, uneven self bias potentials are generated on the anode stage 4 because of the presence of an insulating deposition film 3 such as a metal oxide film being deposited on the wafer 1 mounted on a wafer-mounting area of the anode stage 4 and a redundant electrode area external to that wafer 1, and so on.

The self bias potential generated on the anode stage 4 functions as an opposite force to be exerted on argon ions which are ionized positive ions in plasma. Thus, the self bias potential decreases the speed of argon ions flying to the anode stage 4 and prevents them from their arrivals on the anode stage 4. Therefore, the influence (self-purification) of bombardment with argon ions to a metal oxide film which is depositing on the wafer 1 mounted on the anode stage 4 becomes out of balance when the self bias potentials are unevenly distributed on the wafer 1. Consequently, the characteristics of such a metal oxide film to be obtained (i.e., the composition and molecular structure of the film) becomes inconsistent over the entire surface of the wafer 1, so that uniformity in characteristics of the wafer surface (e.g., a resistance value thereof) becomes deteriorated.

SUMMARY OF THE INVENTION

It is an object of the present invention to provide a method for forming a metal oxide film using a sputtering process, where uniformity in characteristics of the metal oxide film to be formed on a wafer can be improved.

In a first aspect of the present invention, a method for forming a metal oxide film on a wafer on a stage facing to a target by a sputtering process, comprises the steps of: forming a metal film on a part of area on a surface of the stage, a part of area on a surface of the wafer, or both the part of area of the surface of the stage and the part of area of the surface of the wafer; connecting the metal film to a ground; and forming a metal oxide film on the wafer using the sputtering process while the metal film is being grounded.

In this aspect of the present invention, a metal film is formed on a part of area on the surface of the wafer, and the metal film is then connected to a ground, so that the surface of the wafer can be prevented from becoming charged at the time of performing the sputtering process. Or, a metal film is formed on a part of area on the surface of the stage, and the metal film is then connected to a ground. Thus, the potential can be consistent across the entire surface of the wafer and the ions can be uniformly flied on the metal oxide film at the time of performing the sputtering process. As a result, the metal oxide film can be formed to ensure uniform film characteristics.

The surface of the wafer may comprise a pattern area on which devices are arranged in a matrix and an outer area that surrounds the pattern area, and the metal film may be formed on at least the outer area in the step of forming the metal film. Alternatively, the metal film may be formed in a lattice pattern formed between devices on the pattern area in the step of forming the metal film. The metal film in the lattice pattern may be formed on cutting lines of the devices being arranged in the matrix.

The surface of the stage may comprise a wafer-mounting area to be covered with the wafer and a redundant electrode area external to the wafer-mounting area. In this case, the metal film may be formed on the redundant electrode area in the step of forming the metal film.

In a second aspect of the present invention, a method for forming a metal oxide film on a wafer on a stage facing to a target by a sputtering process, comprises the steps of: exposing a metal material constituting the stage by removing at least a part of a deposition film formed on the surface of the stage; connecting the metal material to a ground; and forming a metal oxide film on the wafer using the sputtering process while the metal material is being grounded.

Therefore, the influence of self bias potential on the redundant electrode area of the stage for the ions can be prevented. Thus, the ions can be uniformly flied on the metal oxide film at the time of performing the sputtering process. And, the metal oxide film can be formed to ensure uniform film characteristics.

The surface of the stage may comprise a wafer-mounting area to be covered with the wafer and a redundant electrode area external to the wafer-mounting area, and the deposition film formed on the redundant electrode area may be removed in the step of exposing the metal material being formed as the stage by removing at least the part of the deposition film formed on the surface of the stage. The removal of the deposition film may be performed using an etching process.

In a third aspect of the present invention, a method for forming a metal oxide film on a wafer on a stage facing to a target by a sputtering process, comprises the steps of: electrically suspending the stage by forming an area on which at least a part of an insulating film on the surface of the stage is exposed; and forming a metal oxide film on the wafer using the sputtering process under the conditions in which a potential of the surface of the wafer and a potential of the surface of the stage are substantially equal to each other. Therefore, the ions can be uniformly flied on the metal oxide film at the time of performing the sputtering process. And, the metal oxide film can be formed to ensure uniform film characteristics.

Also, the surface of the stage on which the wafer is placed may be substantially shaped like the surface of the wafer on which the metal oxide film is formed. Thus, the entire surface of the stage can be substantially covered with the wafer. In other words, on the surface of the stage, it is possible to substantially eliminate any area which is not covered with the wafer. As a result, the influence of self bias potential on the redundant electrode area can be prevented, ensuring the uniform potential distribution on the surface of the wafer. Therefore, the ions can be uniformly flied on the metal oxide film at the time of performing the sputtering process. In addition, the metal oxide film may be made of a bolometer material. The metal oxide forming the metal oxide film may have a resistivity of $1 \times 10^{-5}$ to $1 \times 100$ Ω·m. Furthermore, the metal oxide forming the metal oxide film may contain vanadium oxide.

DETAILED DESCRIPTION OF THE PREFERRED EMBODIMENTS

Figure 2:
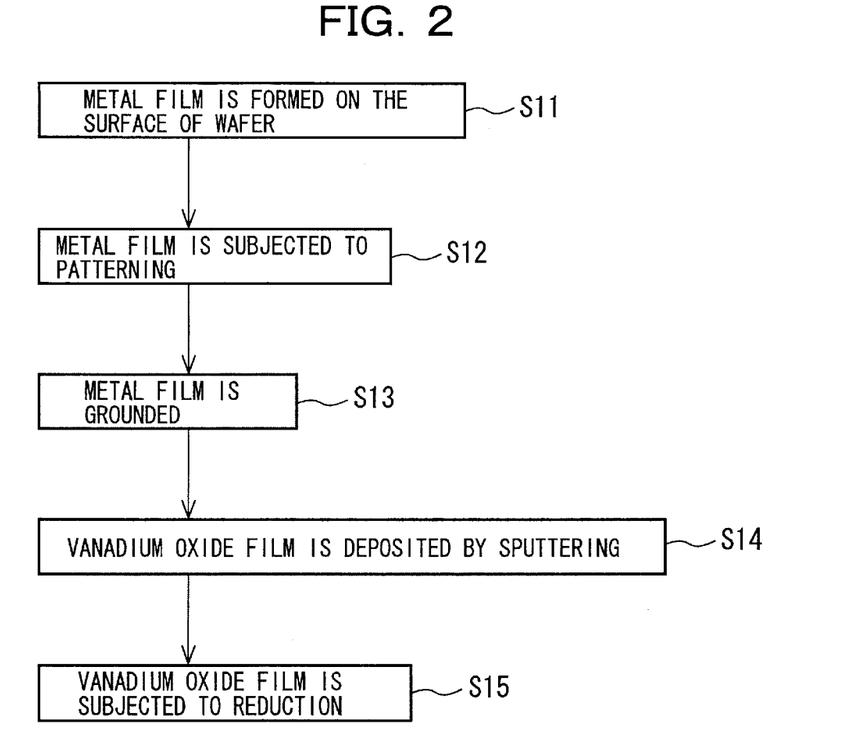
FIG. 2 is a flow chart for showing a method for forming a metal oxide film in accordance with a first embodiment of the present invention.
Figure 3:
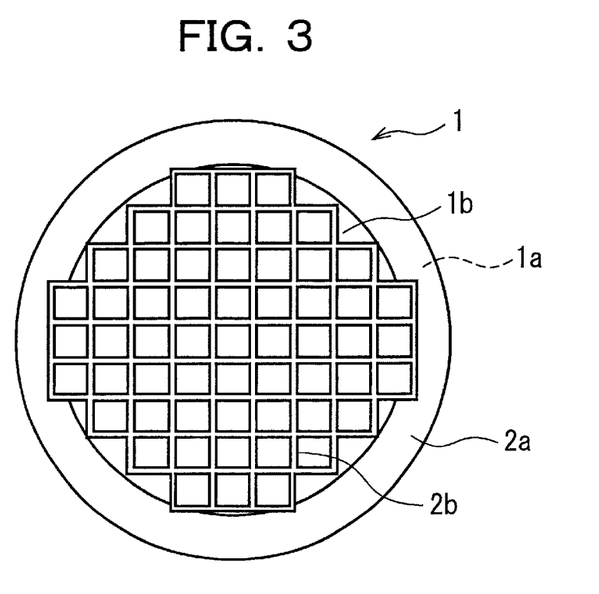
FIG. 3 is a plan view that shows a wafer on which a metal oxide film is formed by the film-forming method in accordance with the first embodiment.
Figure 4:
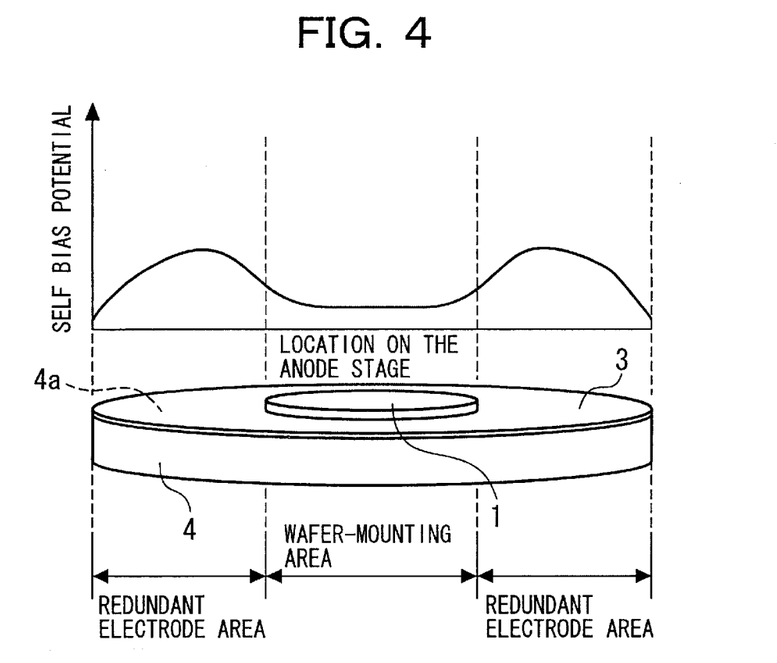
FIG. 4 is a schematic perspective diagram that shows the inside of a sputtering apparatus in accordance with the first embodiment of the present invention, where a wafer is placed on an anode stage, together with a graph that schematically represents the distribution of self bias potentials on the surface of the wafer, in which the locations on the anode stage are plotted on the horizontal axis and the self bias potentials corresponding to the respective locations are plotted on the vertical axis.

Below, preferred embodiments of the present invention will be described in detail with reference to the accompanying drawings. FIG. 2 is a flow chart for showing a method for forming a metal oxide film in accordance with a first embodiment of the present invention. FIG. 3 is a plan view of a wafer on which a metal oxide film is formed by the method in accordance with the first embodiment. And, FIG. 4 is a schematic perspective diagram for showing a wafer 1 mounted on an anode stage 4 equipped in the inside of a sputtering apparatus in accordance with the first embodiment, together with a graph that schematically shows the distribution of self bias potentials on the surface of the wafer, in which the locations on the anode stage are plotted on the horizontal axis and self bias potentials are plotted on the vertical axis of the graph.

As shown in FIG. 3, the wafer 1 comprises a pattern area 1b on which devices are formed in a matrix and an outer area 1a that surrounds the pattern area 1a. In this embodiment, but not limited to, the wafer 1 is 6 inches (15 cm) in diameter.

First, a metal film is formed over the entire surface of the wafer 1 as described in step S11 of FIG. 2. In this embodiment, but not limited to, the metal film is a titanium film. Next, as described in step S12, the metal film is subjected to a patterning process to selectively remove undesired portions, resulting in a ring-shaped metal film 2a formed on the outer area 1a of the wafer 1 and a lattice-patterned metal film 2b formed on the pattern area 1b. The lattice-patterned metal film 2b is formed on the area corresponding to scribe lines of the devices in the matrix on the wafer 1. As described in step S13 of FIG. 2, subsequently, the metal films 2a and 2b are connected to a ground, respectively. Consequently, the area where the metal surface is exposed and connected to a ground potential is thus obtained.

Next, as described in step S14 in FIG. 2, a vanadium oxide film ($VO_x$ film) is formed on the surface of the wafer 1 by means of sputtering deposition. In this first embodiment, a sputtering apparatus (not shown) to be used is that of the magnetron-sputtering type. A metal vanadium plate (not shown) of 8 inches (20 cm) in diameter is mounted as a target on a cathode in the sputtering apparatus. Then, an anode stage 4 (see FIG. 4) is arranged to face the target, followed by fixing the wafer 1 on the anode stage 4. In this embodiment, but not limited to, the anode stage 4 has a diameter of 13 inches (33 cm).

Subsequently, the wafer 1 provided as a substrate is heated at an appropriate temperature (e.g., 220° C.) and rotated on its axis. Then, sputtering deposition of a film on the wafer 1 is performed for 60 minutes, for example, by introducing an appropriate RF power (e.g., 500 W) to the sputtering apparatus under the conditions of, but not limited to, a sputtering pressure of 0.53 Pa, an Ar flow rate of 10 ml/min., and a mixture gas (20% $O_2$+80% Ar) flow rate of 4.8 ml/min. As a result, a vanadium oxide ($VO_x$) film (not shown) is formed on the wafer 1.

At this time, therefore, the distribution of self bias potentials which are considered to be generated on the anode stage 4 can be represented as shown in FIG. 4, so that the lowest self bias potential can be observed on the wafer 1 and the flat distribution thereof can be obtained in the wafer 1.

The resistance of the vanadium oxide film thus obtained is too high and the film may be subjected to a thermal treatment (step S15 in FIG. 2) in a hydrogen atmosphere to allow the reduction thereof to decrease such resistance to within a measurable range. The reduction is performed under the conditions of, for example, a hydrogen pressure of 8,100 Pa and a temperature of 310° C. for 42 hours.

In the first embodiment, before forming the vanadium oxide film on the wafer 1, the metal film 2a is formed on the outer area 1a on the surface of the wafer 1, the lattice-patterned metal film 2b is formed on the pattern area 1b, and these metal films 2a and 2b are connected to a ground. Therefore, the vanadium oxide film is prevented from becoming positively charged at the time of deposition thereof on the wafer 1, so that the increase in self bias potential can be suppressed and the argon ions can be uniformly flied on the wafer 1. As a result, uniformity in resistance values of the vanadium oxide film can be improved. In addition, as the anode stage 4 is rotated on its axis, so that the distribution of characteristics of the vanadium oxide film on the 6-inch wafer 1 can be symmetric with respect to the center of the wafer 1.

By the way, the above-mentioned sputtering conditions are described by way of example. It is possible to change the target and wafer sizes, the RF power, the sputtering pressure and the flow rate of the gas, the heating conditions, and the reduction conditions, and so on, properly.

In the first embodiment, furthermore, the metal films 2a, 2b are made of titanium. Alternatively, the metal material may be not limited to titanium but also any conductive material except titanium so far as it can be adapted in the subsequent processes. In addition, the shape of the area where the metal film 2a is formed is not limited to a specific one. In this case, however, it is preferable that the shape of the area where the metal film 2a is formed may be symmetric with respect to the center of the wafer 1 so far as the self bias potential is uniformly generated on the surface of the wafer 1.

Figure 5:
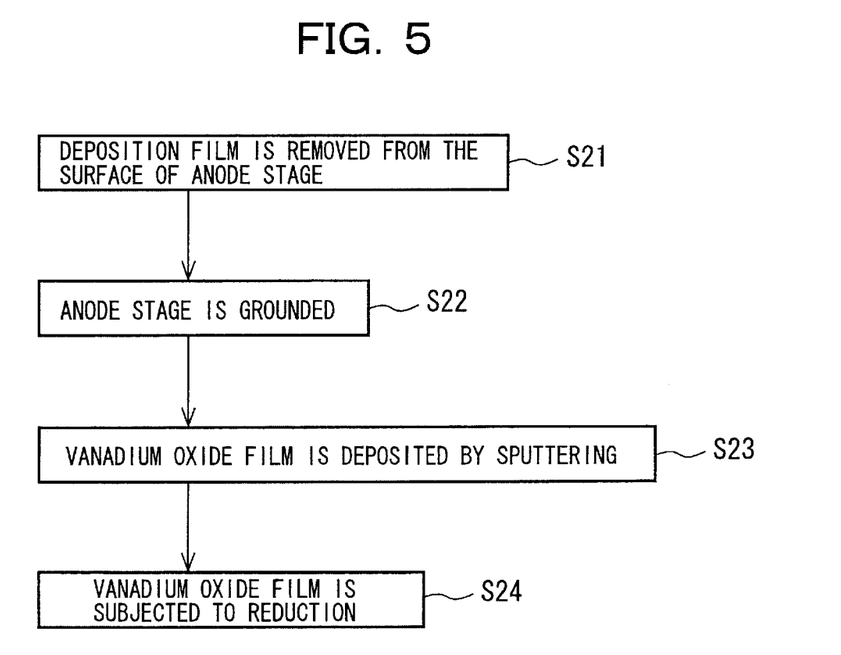
FIG. 5 is a flow chart for showing a method for forming a metal oxide film in accordance with a second embodiment of the present invention.
Figure 6:
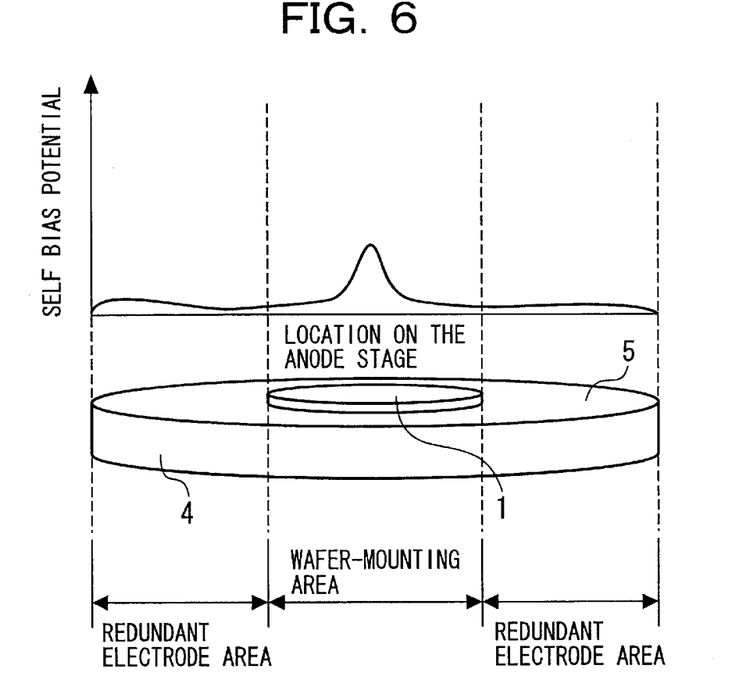
FIG. 6 is a schematic perspective diagram that shows the inside of a sputtering apparatus in accordance with the second embodiment of the present invention, where a wafer is placed on an anode stage, together with a graph that schematically represents the distribution of self bias potentials on the surface of the wafer, in which the locations on the anode stage are plotted on the horizontal axis and the self bias potentials corresponding to the respective locations are plotted on the vertical axis.

Referring now to FIGS. 5 and 6, a method for forming a metal oxide film made of a bolometer material in accordance with a second embodiment of the present invention will be described. FIG. 5 is a flow chart for showing a method for forming a metal oxide film in accordance with the second embodiment, and FIG. 6 is a schematic perspective diagram for showing a wafer 1 mounted on an anode stage 4 equipped in the inside of a sputtering apparatus in accordance with the second embodiment, together with a graph that schematically shows the distribution of self bias potentials on the surface of the wafer 1, in which the locations on the anode stage are plotted on the horizontal axis and self bias potentials are plotted on the vertical axis of the graph.

In the second embodiment of the present invention, as shown in FIG. 6, the anode stage 4 to be used is one having the same size as that of the first embodiment or the conventional one. As described in step S21 of FIG. 5, an insulating deposition film 3 such as a metal oxide film being deposited on the anode stage 4 is removed by an etching process to expose a metal material that makes up the anode stage 4 to form an exposed surface 5. As described in step S22 of FIG. 5, furthermore, the anode stage 4 is connected to a ground.

Subsequently, as described in step S23 of FIG. 5, a 6-inch wafer covered with the insulating film is mounted on the anode stage 4 and is then subjected to a sputtering process to deposit a vanadium oxide film on the wafer, followed by reducing the vanadium oxide film as described in step S24. In this embodiment, the sputtering and reduction processes used in the present embodiment may be the same as those of the first embodiment described above. Consequently, the distribution of self bias potentials as shown in FIG. 6 can be observed during the deposition of the vanadium oxide film. On the other hand, there is no substantial self bias potential on a redundant electrode area 4a on the surface of the anode stage 4, which is not covered with the wafer 1.

In the second embodiment of the present invention, as described above, before forming the vanadium oxide film on the wafer 1, the insulating film being formed on the anode stage 4 is removed by the etching process to expose a metal material that makes up the anode stage 4. Therefore, the influence of self bias potential on the redundant electrode area of the anode stage 4 for the argon ions can be prevented. Therefore, the argon ions can be uniformly directed to the wafer 1. As a result, uniformity in resistance values of the vanadium oxide film can be improved.

In the second embodiment, the deposition film 3 deposited on the redundant electrode area 4a not covered with the wafer 1 on the surface of the anode stage 4 is removed by etching. Instead of removing the deposition film 3 by etching, the deposition film 3 may be covered with a metal film, followed by connecting the metal film to a ground. This also prevents the increase in self bias potential and improves the variation in resistance of the vanadium oxide film.

The second embodiment may be modified by using the structure of the wafer 1 of the first embodiment in addition to the structure of the anode stage 4 of the present embodiment, allowing the increase in uniformity with respect to the resistance of the entire surface of the wafer 1.

Alternatively, it is possible to make the surface potential of the redundant electrode area 4a almost equal to that of the wafer 1 by covering the redundant electrode area 4a of the anode stage 4 with a high-insulating material and adjusting the surface potential of the redundant electrode area 4a to the self bias potential to be generated on the surface of the wafer 1 covered with the insulating film, allowing the improved uniformity in characteristics of the metal oxide film to be formed on the wafer 1.

Figure 7:
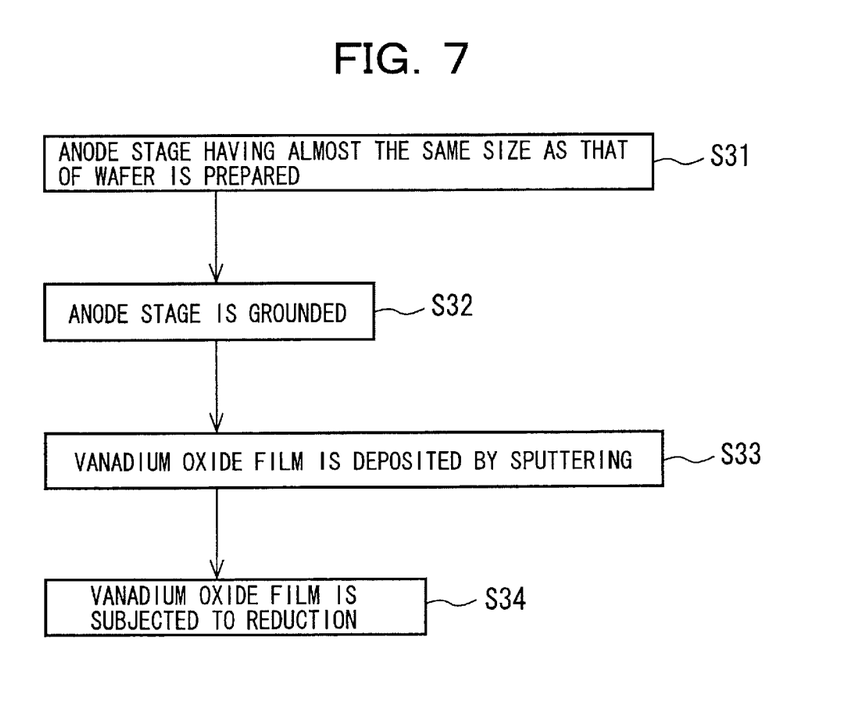
FIG. 7 is a flow chart for showing a method for forming a metal oxide film in accordance with a third embodiment of the present invention.
Figure 8:
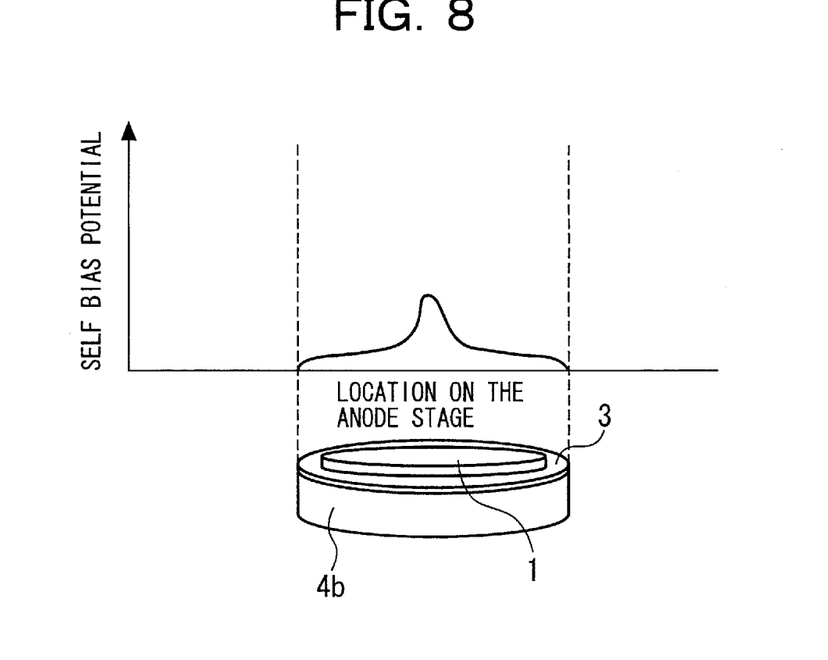
FIG. 8 is a schematic perspective diagram that shows the inside of a sputtering apparatus in accordance with the third embodiment of the present invention, where a wafer is placed on an anode stage, together with a graph that schematically represents the distribution of self bias potentials on the surface of the wafer, in which the locations on the anode stage are plotted on the horizontal axis and the self bias potentials corresponding to the respective locations are plotted on the vertical axis.

Referring now to FIGS. 7 and 8, we will describe a method for forming a metal oxide film made of a bolometer material in accordance with a third embodiment of the present invention. FIG. 7 is a flow chart for showing a method for forming a metal oxide film in accordance with the third embodiment, and FIG. 8 is a schematic perspective diagram for showing a wafer 1 mounted on an anode stage 4b equipped in the inside of a sputtering apparatus in accordance with the present embodiment, together with a graph that schematically shows the distribution of self bias potentials on the surface of the wafer, in which the locations on the anode stage are plotted on the horizontal axis and self bias potentials are plotted on the vertical axis of the graph.

As shown in step S31 of FIG. 7, at first, an anode stage 4b of 10 inches (25 cm) or less in diameter is prepared with reference to a wafer of 6 inches (15 cm) in diameter, in contrast to that of 13 inches (33 cm) in diameter used in the first embodiment or the conventional one described above. A deposition film 3 is deposited on the surface of the anode stage 4b. In this embodiment, however, any part of the film 3 is not removed from there in contrast to the second embodiment.

As described in step S32 of FIG. 7, furthermore, the anode stage 4b is connected to a ground. Subsequently, as described in step S33, a 6-inch wafer 1 covered with the insulating film is mounted on the anode stage 4b and is then subjected to a sputtering process to deposit a vanadium oxide film on the wafer 1, followed by reducing the vanadium oxide film as described in step S34. In this embodiment, the sputtering and reduction processes used in the present embodiment may be the same as those of the first embodiment described above.

As the anode stage 4b has its wafer-mounting surface with the shape almost similar to the surface of the wafer 1, the use of such an anode stage 4b allows that the distribution of self bias potentials can be observed as shown in FIG. 8 during the deposition of the vanadium oxide film. In other words, the surface area of the redundant electrode area on the anode stage 4b is small, so that the self bias potential of such an area shows no substantial influence on the surface potential of the wafer 1. Accordingly, the self bias potential of the surface of the wafer 1 may be considered as one that comes only from the wafer itself, so that the potentials of the areas except a central one can be comparatively equalized while the center area of the wafer is substantially higher than other areas. Therefore, the vanadium oxide film is prevented from becoming positively charged at the time of deposition thereof on the wafer 1, so that the increase in self bias potential can be suppressed and the argon ions can be uniformly directed to the wafer 1. As a result, uniformity in resistance values of the vanadium oxide film can be improved.

Alternatively, the anode stage 4b of the third embodiment and the wafer 1 on which the metal films 2a and 2b are formed as described in the above first embodiment may be used to make the self bias potential of the surface of the wafer 1 more consistent, allowing the formation of the vanadium oxide film having the distribution of resistance thereof with a high uniformity on the surface of the wafer 1.

As described above, the method for forming a metal oxide film made of a bolometer material in accordance with the first, second and third embodiments of the present invention comprises the step of forming the conductive film on the surface of the wafer or the anode stage and removing the metal oxide film on the surface of the anode stage or matching the size of the anode stage to that of the wafer. Therefore, such a method allows the uniform deposition of the metal oxide film made of the bolometer material on the wafer so that the film has the uniform distribution of resistance thereof by preventing the self bias potential of the surface of the wafer from becoming varied, without requiring any additional intermediate electrode or any mechanism of applying an anode bias potential.

In each of the above embodiments, the metal oxide film is the vanadium oxide ($VO_x$) film having a resistivity of about 0.001 to 1 $\Omega \cdot m$. According to the present invention, however, it is not limited to such a film. The same effects can be obtained using another metal oxide film having a resistibility of about $1 \times 10^{-5}$ to 100 $\Omega \cdot m$ just as with that of a semiconductor film that tends to generate a self bias potential. Furthermore, the above embodiments allow the formation of the metal oxide film having the characteristics with high uniformity if the metal oxide film is prepared using a reactive sputtering process whatever the sputtering apparatus. In other words, the sputtering apparatus may be a sheet-fed type sputtering apparatus using an anode having a comparatively smaller area and processing the substrates one by one or a batch type sputtering apparatus using an anode having a larger area in comparison with the wafer size and processing plural substrates simultaneously.

Hereinafter, effects of the present invention will be described concretely in comparison with comparative examples which are beyond the scope of the present invention as defined in the appended claims. The anode stage 4, 4b or the wafer 1 in each of the above first to third embodiments was subjected to one of the treatments as described in the following first to fourth tests. Then, a vanadium oxide ($VO_x$) film was deposited on the wafer 1 using a sputtering process, followed by measuring the resistance value of the resulting vanadium oxide film on the wafer 1. The conditions of the respective tests and the results obtained in the respective tests will be described as follows.

[First Test Result]

In the first test, a vanadium oxide film was deposited on a wafer by the method as described in the above first embodiment. Then, the resistance value of the resulting vanadium oxide film was measured. That is, as shown in FIG. 3, metal films 2a and 2b were formed on the wafer 1, followed by forming the vanadium oxide film thereon.

Figure 9:
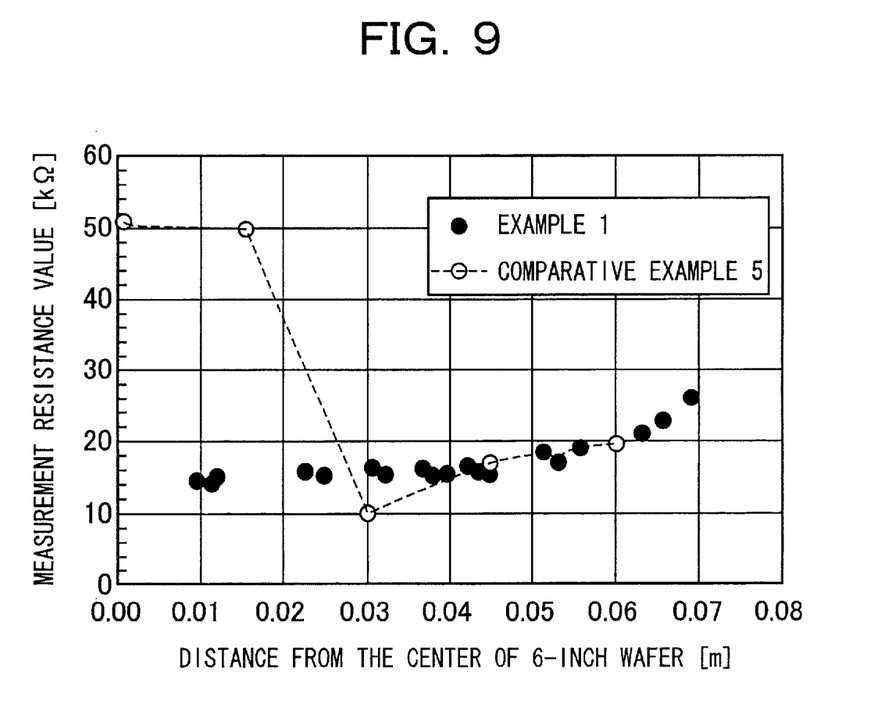
FIG. 9 is a graph that represents the distribution of measured resistance values of the vanadium oxide film formed by the method in accordance with the first test, in which the distances from the center of the wafer are plotted on the horizontal axis and the measured resistance values corresponding to the respective distances are plotted on the vertical axis.

FIG. 9 is a graph that shows the distribution of the measured resistance values of the vanadium oxide film prepared by the method of the first test, where the locations from the center of the wafer are plotted on the horizontal axis and the measured resistance values are plotted on the vertical axis.

As shown in FIG. 3, at first, metal films 2a and 2b were formed on the surface of the wafer 1 being covered with an insulating film just as in the case with the above first embodiment and were then connected to a ground electrode.

Subsequently, the wafer 1 was fixed on the anode stage 4 having the same size as that of the conventional one. The wafer 1 has a diameter of 6 inches (15 cm), and the anode stage 4 has a diameter of 13 inches (33 cm). Next, a vanadium oxide film was deposited on the wafer 1 by a sputtering process just as in the case with the above first embodiment. In this case, the temperature of the wafer 1 was adjusted to 220° C. and was rotated on its axis. In addition, the vanadium oxide film was deposited on the wafer 1 for 60 minutes by introducing an RF power of 500 W to the sputtering apparatus under the conditions of a sputtering pressure of 0.53 Pa, an Ar flow rate of 10 ml/min., and a mixture gas (20% $O_2$+80% Ar) flow rate of 4.8 ml/min.

Next, the vanadium oxide film formed on the wafer 1 was subjected to a reduction process, just as in the case with the above first embodiment, under the conditions of a hydrogen pressure of 8,100 Pa and a temperature of 310° C. for 42 hours. Then, the wafer 1 was subjected to an etching process, followed by measuring its resistance as that of a device by connecting to a read electrode. In this case, the resulting wafer was referred to as Example 1.

For making a comparison, a vanadium oxide film was deposited on a wafer by the conventional method. That is, as shown in FIG. 1, a wafer without metal films 2a and 2b formed thereon was prepared. Then, a vanadium oxide film was deposited on the wafer and was then subjected to a reduction process under the same conditions as those of Example 1. Therefore, it is referred to as Comparative Example 5.

The resulting resistance values of Example 1 and Comparative Example 5 are listed in Table 1 and FIG. 9. In Table 1, the term "dispersion" denotes a value defined by the ratio between "maximum value−minimum value" and "maximum value+minimum value". In addition, in FIG. 9, Example 1 is indicated with solid circles (●) and Comparative Example 5 is indicated with open circles (○).

TABLE 1

| Example 1 | | Comparative example 5 | |
| --- | --- | --- | --- |
| Distance from the center of wafer (cm) | Resistance value (kΩ) | Distance from the center of wafer (cm) | Resistance value (kΩ) |
| 1.0 | 14.5 | 0.0 | 50.6 |
| 1.1 | 14.5 | 1.5 | 49.6 |
| 1.2 | 14.8 | 3.0 | 10.5 |
| 2.3 | 15.7 | 4.5 | 16.5 |
| 2.5 | 15.4 | 6.0 | 19.5 |
| 3.1 | 16.2 | Mean value | 29.3 |
| 3.2 | 15.4 | Standard deviation (S.D. Σ) | 19.23 |
| 3.7 | 16.3 | | |
| 3.7 | 15.9 | Dispersion (± %) | 65.6 |
| 3.8 | 15.6 | | |
| 4.0 | 15.6 | | |
| 4.2 | 16.6 | | |
| 4.3 | 16.3 | | |
| 4.4 | 15.9 | | |
| 4.5 | 15.8 | | |
| 5.2 | 18.1 | | |
| 5.3 | 16.7 | | |
| 5.6 | 18.7 | | |
| 5.6 | 18.8 | | |
| 6.4 | 20.7 | | |
| 6.6 | 22.6 | | |
| 6.9 | 25.9 | | |
| Mean value | 17.1 | | |
| Standard deviation (S.D. Σ) | 2.80 | | |
| Dispersion (± %) | 28.2 | | |

As shown in Table 1 and FIG. 9, Example 1 in which the metal films 2a and 2b were formed on the surface of the wafer 1 showed a standard deviation of 2.80 and a dispersion of ±28.2%. On the other hand, Comparative Example 5 showed a standard deviation of 19.23 and a dispersion of ±65.6%. Therefore, uniformity in device resistance of Example 1 of the present invention was greatly improved, compared with that of Comparative Example 5.

[Second Test Result]

In this second test, a vanadium oxide film was deposited on a wafer by the method of the above second embodiment and was then subjected to the procedure of measuring its resistance value. As shown in FIG. 6, at first, an insulating film formed on the surface of an anode stage 4 was removed. Then, the wafer 1 was fixed on the anode stage 4, followed by performing a sputtering process to form the vanadium oxide film on the wafer 1. Subsequently, the resulting vanadium oxide film was subjected to a reduction process, followed by subjecting to an etching process and connecting each device to a read electrode. The conditions of sputtering and reduction were same as those of the first test. Subsequently, the resistance value of the vanadium oxide film was measured and represented as Example 2.

Figure 10:
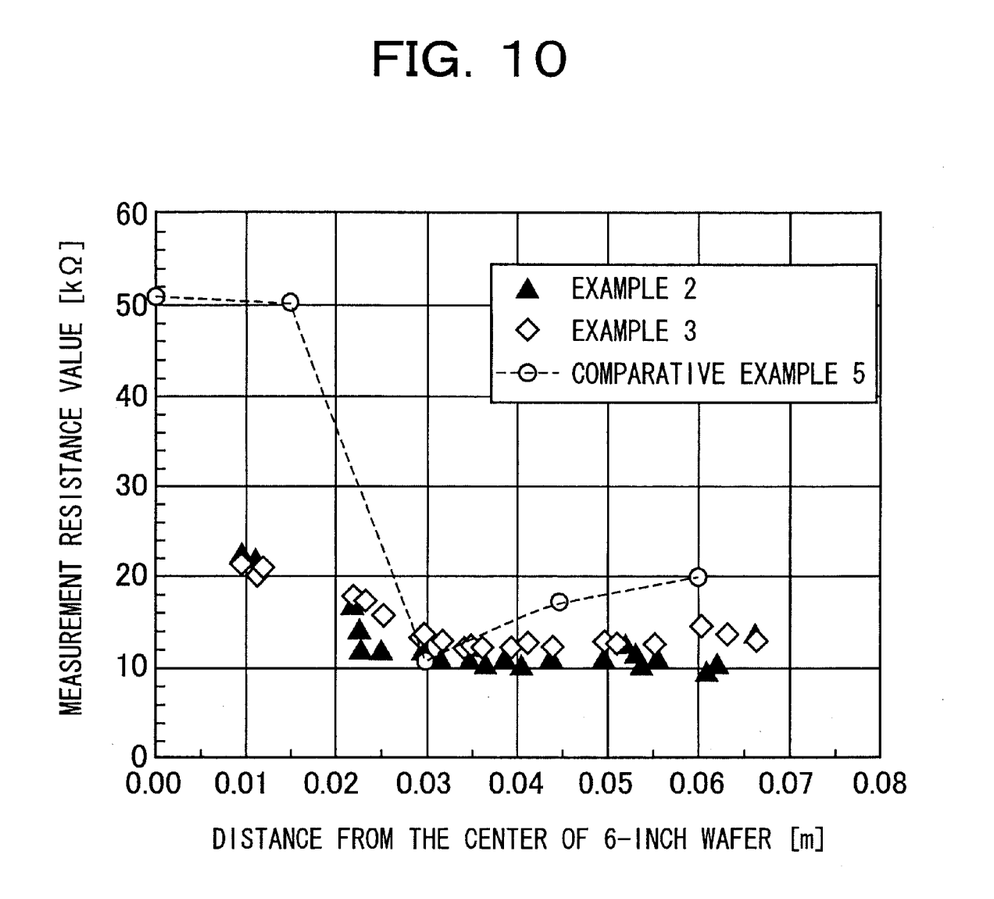
FIG. 10 is a graph that represents the distribution of measured resistance values of the vanadium oxide film formed by the method in accordance with the second and third tests, in which the distances from the center of the wafer are plotted on the horizontal axis and the measured resistance values corresponding to the respective distances are plotted on the vertical axis.

FIG. 10 is a graph for showing the distribution of measured resistance values of the vanadium oxide film formed on the wafer by the method in accordance with the second test and third test described below. In the graph, the distances from the center of the wafer are plotted on the horizontal axis and the measured resistance values are plotted on the vertical axis. In addition, the measured resistance values of Example 2 are listed in Table 2 in addition to FIG. 10. In FIG. 10, furthermore, the measured values of Comparative Example 5 are also shown. In FIG. 10, the measurement results of Example 2 are indicated with solid triangles (▲) and those of Comparative Example 5 are indicated with open circles (○), respectively.

TABLE 2

| Example 2 | | Example 3 | |
|---|---|---|---|
| Distance from the center of wafer (cm) | Resistance value (kΩ) | Distance from the center of wafer (cm) | Resistance value (kΩ) |
| 1.0 | 22.4 | 0.9 | 21.6 |
| 1.1 | 21.9 | 1.1 | 20.5 |
| 2.2 | 17.0 | 1.2 | 21.2 |
| 2.2 | 14.1 | 2.2 | 18.0 |
| 2.3 | 11.9 | 2.3 | 17.2 |
| 2.5 | 11.6 | 2.5 | 15.7 |
| 3.0 | 11.6 | 2.9 | 13.5 |
| 3.2 | 11.3 | 3.0 | 13.7 |
| 3.5 | 11.2 | 3.2 | 12.6 |
| 3.7 | 10.4 | 3.5 | 12.2 |
| 3.9 | 10.9 | 3.6 | 12.4 |
| 4.1 | 10.1 | 3.7 | 12.4 |
| 4.4 | 11.0 | 4.0 | 11.7 |
| 5.0 | 11.2 | 4.2 | 12.3 |
| 5.2 | 12.2 | 4.4 | 11.8 |
| 5.3 | 11.1 | 5.0 | 12.6 |
| 5.4 | 10.4 | 5.1 | 12.4 |
| 5.5 | 11.1 | 5.5 | 11.8 |
| 6.1 | 9.0 | 6.1 | 14.2 |
| 6.2 | 9.8 | 6.3 | 13.3 |
| 6.6 | 13.3 | 6.6 | 12.5 |
| Mean value | 12.5 | Mean value | 14.5 |
| Standard deviation (S.D. Σ) | 3.60 | Standard deviation (S.D. Σ) | 3.26 |
| Dispersion (± %) | 42.7 | Dispersion (± %) | 29.7 |

As shown in Table 2, Example 2 showed a standard deviation of 3.60 and a dispersion of ±42.7%. Comparing with Comparative Example 5 in Table 1, it is shown that the extent of the resistance variation on the surface of the wafer was substantially improved.

In FIG. 10, the measured resistance value was increased in the neighborhood of the center of the wafer 1 (i.e., at a small distance from the center). It is considered that the self bias potential at the center of the wafer increases as the wafer itself is covered with the metal oxide film.

[Third Test Result]

In this third test, a vanadium oxide film was deposited on a wafer by the method of the third embodiment described above and was then subjected to the procedure of measuring its resistance value. As shown in FIG. 8, an anode stage 4b of 10 inches (25 cm) or smaller in diameter was prepared for a wafer of 6 inches (15 cm) in diameter. Then, the wafer 1 was fixed on the anode stage 4b, followed by performing a sputtering process to form the vanadium oxide film on the wafer 1. In this case, the same sputtering conditions as those of the first test were used.

Subsequently, the resulting vanadium oxide film was subjected to a reduction process, followed by subjecting to an etching process and connecting each device to a read electrode to complete a device. The resistance values of the devices were measured. The conditions of reduction were same as those of the first test. This is represented as Example 3. The resistance values of Example 3 were listed in Table 2 and shown in FIG. 10. In FIG. 10, the measurement results of Example 3 were indicated with open rhombuses (◊). As shown in Table 2 and FIG. 10, Example 3 showed a standard deviation of 3.26 and a dispersion of ±29.7%. Comparing with Comparative Example 5, the uniformity in device resistance was greatly improved only by bringing the size of the anode stage close to that of the wafer 1.

[Fourth Test Result]

Figure 11:
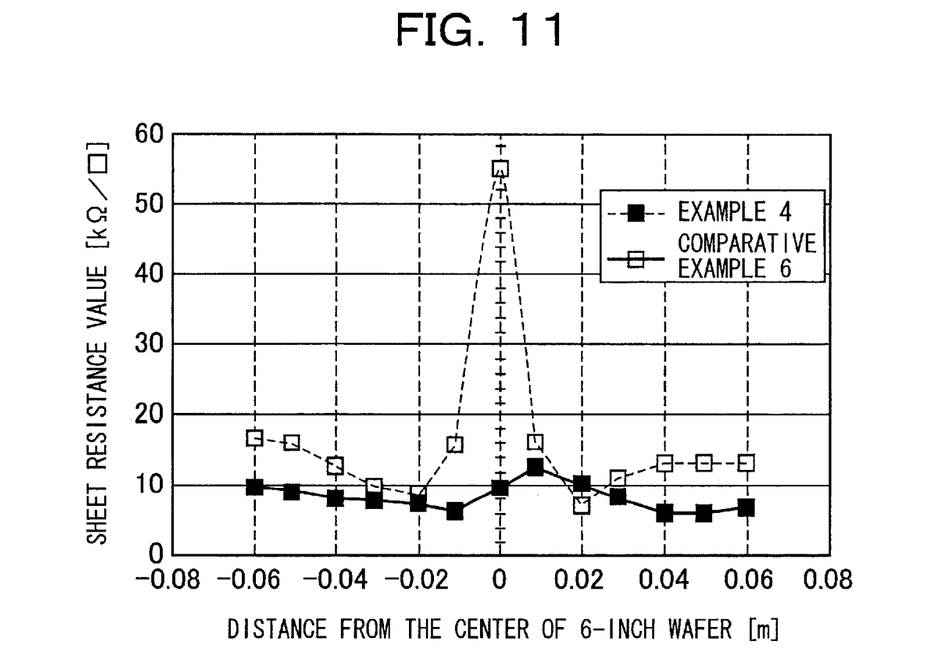
FIG. 11 is a graph that represents the distribution of sheet resistance values of the vanadium oxide film formed by the method in accordance with the fourth test of the present invention, in which the distances from the center of the wafer are plotted on the horizontal axis and the measured sheet resistance values corresponding the respective distances are plotted on the vertical axis.
Figure 12:
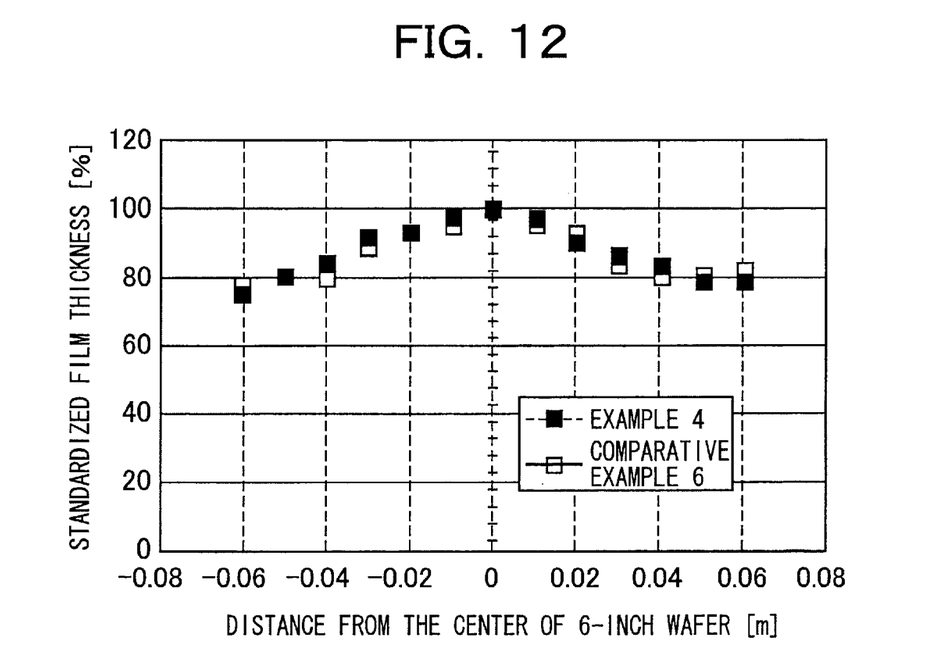
FIG. 12 is a graph that represents the distribution of standardized film thickness of the vanadium oxide film formed by the method in accordance with the fourth test of the present invention, in which the distances from the center of the wafer are plotted on the horizontal axis and the standardized film thickness corresponding to the respective distances are plotted on the vertical axis.

FIG. 11 is a graph that represents the distribution of sheet resistance values of the vanadium oxide film formed by the method in accordance with the fourth test, in which the distances from the center of the wafer are plotted on the horizontal axis and the measured sheet resistance values corresponding to the respective distances are plotted on the vertical axis. In addition, FIG. 12 is a graph that represents the distribution of standardized film thickness of the vanadium oxide film formed by the method of the present test, in which the distances from the center of the wafer are plotted on the horizontal axis and the standardized film thickness corresponding to the respective distances are plotted on the vertical axis.

In this fourth test, a vanadium oxide ($VO_x$) film was deposited on a flat wafer 1 with an insulating film on a small-sized anode stage 4b as described in the above third embodiment. The resulting vanadium oxide film was subjected to a reduction thermal treatment. In this test, any device structure was not fabricated on the wafer in contrast to the above third test. Then, the vanadium oxide film on the wafer 1 was then subjected to the procedure of measuring its sheet resistance value, and then the resulting sheet resistance values were represented as those of Example 4. The resulting sheet resistance values are listed in Table 3 and shown in FIG. 11. In Table 3 and FIG. 11, the distribution of sheet resistance values of the vanadium oxide film prepared by the conventional method as shown in FIG. 1 is also shown. It is referred to as Comparative Example 6. Furthermore, the distribution of film thickness of the vanadium oxide film of each of Example 4 and Comparative Example 6 is shown in FIG. 12. The film thickness is one standardized by the most thick portion of the center of the wafer. In FIGS. 11 and 12, the results of the measurement on Example 4 are indicated with solid rectangles (■) and the results of the measurement on Comparative Example 6 are indicated with open rectangles (□), respectively.

TABLE 3

| Distance from the center of wafer | Sheet resistance value (kΩ/□) | |
|---|---|---|
| (cm) | Example 4 | Comparative example 6 |
| 6 | 6.5 | 12.9 |
| 5 | 5.7 | 13.0 |
| 4 | 5.9 | 13.1 |
| 3 | 7.9 | 10.7 |
| 2 | 10.0 | 7.1 |
| 1 | 12.9 | 16.2 |
| 0 | 9.7 | 54.6 |
| −1 | 6.5 | 16.0 |
| −2 | 7.5 | 8.8 |
| −3 | 7.7 | 10.0 |
| −4 | 8.2 | 12.5 |
| −5 | 9.2 | 15.3 |
| −6 | 10.2 | 17.0 |
| Mean value | 8.3 | 15.9 |
| Standard deviation (S.D. Σ) | 2.05 | 11.99 |
| Dispersion (± %) | 39 | 77 |

As shown in Table 3, Example 4 showed a standard deviation of 2.05 and a dispersion of ±39%, while Comparative Example 6 showed a standard deviation of 11.99 and a dispersion of ±77%. It is obvious from the results that the effects of the present invention could be observed in spite of prior to construct any device on the wafer. As is evident from FIG. 11, comparing with Comparative Example 6, the influence of self bias potential on the outer area 1a (the redundant electrode area) on the surface of the wafer 1 was canceled in Example 4. In the center of the wafer 1, furthermore, the sheet resistance was substantially uniform, so that the uniformity in distribution of sheet resistance values in Example 4 could be excellent compared with that of Comparative Example 6.

As shown in FIG. 12, furthermore, there was no substantial difference between the film thickness of Example 4 and that of Comparative Example 6, and they were almost coincident with each other. Therefore, the difference between the sheet resistance distribution in Example 4 and that of Comparative Example 6 shown in FIG. 11 can be considered as the difference in characteristics of each vanadium oxide film itself formed by sputtering. Furthermore, each of the first to third tests showed similar results with respect to this distribution of film thickness.

What is claimed is:

1. A method for forming a metal oxide film on a wafer on a stage facing to a target by a sputtering process, comprising the steps of:

forming a metal film on a part of area on a surface of said stage, a part of area on a surface of said wafer, or both the part of area of the surface of said stage and the part of area of the surface of said wafer;

connecting the metal film to a ground; and forming a metal oxide film on said wafer using the sputtering process while said metal film is being grounded.

2. The method for forming a metal oxide film according to claim 1, wherein the surface of said stage comprises a wafer-mounting area to be covered with said wafer and a redundant electrode area external to said wafer-mounting area, and said metal film is formed on said redundant electrode area in said step of forming the metal film.

3. The method for forming a metal oxide film according to claim 1, wherein the surface of said stage on which said wafer is placed is substantially shaped like the surface of said wafer on which said metal oxide film is formed.

4. A method for forming a metal oxide film on a wafer on a stage facing to a target by a sputtering process, comprising the steps of:

forming a metal film on a part of area on a surface of said stage, a part of area on a surface of said wafer, or both the part of area of the surface of said stage and the part of area of the surface of said wafer;

connecting the metal film to a ground; and forming a metal oxide film on said wafer using the sputtering process while said metal film is being grounded, wherein the surface of said water comprises a pattern area on which devices are arranged in a matrix and an outer area that surrounds the pattern area, and said metal film is formed on at least said outer area in said step of forming the metal film.

5. The method for forming a metal oxide film according to claim 4, wherein said metal film is formed in a lattice pattern formed between said devices on said pattern area in said step of forming the metal film.

6. A method for forming a metal oxide film on a wafer on a stage facing to a target by a sputtering process, comprising the steps of:

forming a metal film on a part of area on a surface of said stage, a part of area on a surface of said wafer, or both the part of area of the surface of said stage and the part of area of the surface of said wafer;

connecting the metal film to a ground; and forming a metal oxide film on said wafer using the sputtering process while said metal film is being grounded, wherein the surface of said wafer comprises a pattern area on which devices are arranged in a matrix and an outer area that surrounds the pattern area, and said metal film is formed in a lattice pattern formed between said devices on at least said pattern area in said step of forming the metal film.

7. The method for forming a metal oxide film according to claim 6, wherein said metal film in the lattice pattern is formed on cutting lines of said devices being arranged in the matrix.

8. A method for forming a metal oxide film on a wafer on a stage facing to a target by a sputtering process, comprising the steps of:

forming a metal film on a part of area on a surface of said stage, a part of area on a surface of said wafer, or both the part of area of the surface of said stage and the part of area of the surface of said wafer;

connecting the metal film to a ground; and forming a metal oxide film on said wafer using the sputtering process while said metal film is being grounded, wherein said metal oxide film is made of a bolometer material.

9. The method for forming a metal oxide film according to claim 8, wherein the metal oxide forming said metal oxide film contains vanadium oxide.

10. A method for forming metal oxide film on a wafer on a stage facing to a target by a sputtering process, the method wherein the surface of said stage includes a wafer-mounting area to be covered with the wafer and a redundant electrode area external to the wafer-mounting area, comprising the steps of:

covering the redundant electrode area with an insulating film; and forming a metal oxide film on said wafer using the sputtering process under conditions in which a potential of the surface of said wafer and a potential of the insulating film are substantially equal to each other.

11. A method for forming a metal oxide film on a wafer on a stage facing to a target by a sputtering process, comprising the steps of:

exposing a metal material constituting said stage by removing at least a part of a deposition film formed on the surface of said stage;

connecting the metal material to a ground; and forming a metal oxide film on said wafer using the sputtering process while the metal material is being grounded.

12. The method for forming a metal oxide film according to claim 11, wherein the surface of said stage comprises a wafer-mounting area to be covered with said wafer and a redundant area external to said wafer-mounting area and having the deposition film thereon, and said deposition film on said redundant electrode area is removed in said step of exposing the metal material.

13. The method for forming a metal oxide film according to claim 11, wherein the removal of said deposition film is performed using an etching process.

14. A method for forming a metal oxide film on a wafer on a stage facing to a target by a sputtering process, comprising the steps of:

forming a metal film on a part of area on a surface of said stage, a part of area on a surface of said wafer, or both the part of area of the surface of said stage and the part of area of the surface of said wafer;

connecting the metal film to a ground; and forming a metal oxide film on said wafer using the sputtering process while said metal film is being grounded, wherein the metal oxide forming said metal oxide film has a resistivity of $1 \times 10^{-5}$ to $1 \times 100$ $\Omega \cdot m$.

* * * * *